(12) United States Patent
Heuermann et al.

(10) Patent No.: US 7,109,827 B2
(45) Date of Patent: Sep. 19, 2006

(54) FILTER ARRANGEMENT FOR BALANCED AND UNBALANCED LINE SYSTEMS

(75) Inventors: Holger Heuermann, Weyarn (DE); Jens Ruediger, Duesseldorf (DE)

(73) Assignee: Infineon Technologies AG, Munich (DE)

( * ) Notice: Subject to any disclaimer, the term of this patent is extended or adjusted under 35 U.S.C. 154(b) by 176 days.

(21) Appl. No.: 10/477,976

(22) PCT Filed: Apr. 25, 2002

(86) PCT No.: PCT/EP02/04617

§ 371 (c)(1),
(2), (4) Date: Jul. 7, 2004

(87) PCT Pub. No.: WO02/093741

PCT Pub. Date: Nov. 21, 2002

(65) Prior Publication Data

US 2004/0248542 A1 Dec. 9, 2004

(30) Foreign Application Priority Data

May 14, 2001 (DE) .................. 101 23 369

(51) Int. Cl.
H03H 9/54 (2006.01)
H03H 9/64 (2006.01)
H01P 1/20 (2006.01)

(52) U.S. Cl. .................. 333/189; 333/193; 333/202

(58) Field of Classification Search ........ 333/187–189, 333/193–195, 204
See application file for complete search history.

(56) References Cited

U.S. PATENT DOCUMENTS

| | | | |
|---|---|---|---|
| 1,848,221 A | 3/1932 | McCurdy | 333/170 |
| 5,392,011 A | 2/1995 | Li | 333/174 |
| 5,486,800 A * | 1/1996 | Davenport | 333/193 |
| 5,499,003 A * | 3/1996 | Davenport | 333/195 |
| 5,541,560 A * | 7/1996 | Turunen et al. | 333/207 |
| 5,666,093 A | 9/1997 | D'Ostilio | 333/207 |
| 5,689,221 A * | 11/1997 | Niiranen et al. | 333/202 |
| 5,910,756 A | 6/1999 | Ella | 333/133 |
| 6,140,891 A * | 10/2000 | Nakakubo et al. | 333/204 |
| 6,441,704 B1 * | 8/2002 | Ali-Hackl et al. | 333/193 |
| 6,529,096 B1 * | 3/2003 | Maekawa et al. | 333/134 |
| 6,633,209 B1 * | 10/2003 | Kushitani et al. | 333/175 |
| 6,670,866 B1 * | 12/2003 | Ella et al. | 333/133 |
| 2004/0095212 A1 * | 5/2004 | Iwasaki et al. | 333/204 |

FOREIGN PATENT DOCUMENTS

| | | |
|---|---|---|
| DE | 37 24 727 C1 | 12/1988 |
| DE | 198 21 353 A1 | 11/1999 |
| JP | 61013706 | 1/1986 |

OTHER PUBLICATIONS

Orlov, A.T. et al. "Use of Active Networks to Widen the Spectrum of Application of Piezoelectric Filters," 1994 IEEE International Frequency Control Symposium, pp. 411-414, XP 010137841.

Feldtkeller, Richard. *Einfuhrung in die Siebschaltungstheorie der Elektrischen Nachrichtentechnik*. 6th Edition, Stuttgart: S. Hirzel Verlag, 1967.

* cited by examiner

*Primary Examiner*—Barbara Summons
(74) *Attorney, Agent, or Firm*—Baker Botts L.L.P.

(57) ABSTRACT

A filter arrangement includes one first resonator circuit connected between a first node and a second node. A second resonator circuit is connected between a third node and a fourth node. The first resonator circuit and the second resonator circuit are intercoupled. Further, an inductive device is provided, connected between the first node and the third node.

18 Claims, 7 Drawing Sheets

FILTER ARRANGEMENT FOR BALANCED AND UNBALANCED LINE SYSTEMS

BACKGROUND OF THE INVENTION

1. Field of the Invention

The present invention relates to a filter arrangement and in particular to a resonator band-pass filter arrangement for balanced and unbalanced line systems.

2. Description of the Prior Art

Band-pass filters are needed in almost any microwave application. In particular narrow-band transmit/receive circuits (so called transceiver-circuits), as they are used in mobile radio communication systems, need band-pass filters in order to suppress all interference signals from outside the used frequency band. Thus, large interference signals cannot limit the receiver and small interference signals do not deteriorate the basic noise. Further, band-pass filters are used in so-called mutiband systems in order to select the individual bands over frequency-separating filters, so-called diplexers.

Good band-pass filters distinguish themselves by showing very little electrical losses in the passband and having as much isolation as possible in the stopband and/or blocking band.

Frequently, resonators are used in band-pass filters. A serial resonator is concerned, if this two-terminal element shows a very good passband performance with the resonance frequency, if connected in series. For other frequencies this element shows a blocking performance. A parallel resonator is concerned, if this two-terminal element shows a very good passband performance with the resonance frequency if connected between the signal path and a reference potential, like e.g. ground. For other frequencies this element shows a blocking performance.

A balanced transformer (Balun) is used, where a transition from an unbalanced to a balanced line system, e.g. a microwave line system, or the contrary is necessary. In modern handset devices small signal transmitter/receiver circuits (small signal transceiver) integrated in semiconductors exclusively have balanced inputs and outputs. However, power amplifiers and antennas are implemented in an unbalanced technique. Therefore, two networks are required for every frequency band in such handset devices in order to realize low-loss transitions between the balanced power system and the unbalanced power system. In the mobile radio area unbalanced circuits, like e.g. diplexers, are the conventional and only used circuits so far. Further, a large number of line systems used in practice are unbalanced systems, like e.g. coaxial, microstrip and strip lines.

For realizing band-pass filters a large numbers of realization possibilities exist.

For many decades filters having concentrated inductive members and capacities or having line structures have been known. In frequency-separating filters (diplexers) usually pure line structures are used.

For narrow-band filter applications surface acoustic wave filters, the so-called SAW-filters, have been used for years, in which non-coupled resonators are used. Such non-coupled resonators are for example arranged in the so-called ladder-type structure.

For narrow-band band-pass filters realizations with coupled resonators have only become established for circuits in the mobile radio area in the last few years. These filter realizations especially distinguish themselves by their very steep filter edges. This technology finds its use with large resonators, e.g. of cylindrical ceramics with low losses and a large dielectric constant and with filters for great powers, like they are for example used in base stations.

The above described, known filter realizations are disadvantageous in so far, that they are exclusively available for balanced line systems or exclusively for unbalanced line systems. Thus, the filter realizations either comprise a balanced input gate and a balanced output gate or an unbalanced input gate and an unbalanced output gate. Mixed constructions of coupled resonators and concentrated devices, like for example inductive devices, are not known.

Omitting the balanced transformer, the balun, is only known in the art in combination with surface acoustic wave filters (SAW filters). The relatively extensive and costly SAW filters offer a possibility of balancing the unbalanced signals by inserting a physically very short 180° degree line in the acoustic area. SAW filters offer a very steep filter characteristic with average throughput losses of about 2 to 3 dB and have established themselves as receiving filters ahead of the preamplifiers of the transmit-receive circuits. On the transmission side of the transmit/receive circuits mainly balanced transformers (Baluns) realized in ceramics are used.

The drawback of the above-described realizations of band-pass filters known in the art is on the one hand, that band-pass filters having discrete inductive devices and capacitors for commercial microwave products produced in large amounts are of no interest, as the number of required devices is very high and therefore the required area is very large. Further, the losses in the passband are intolerably high. In contrast to that, coupled resonator filters offer better selection properties with lower losses than the "interconnected" resonator filters, like for example the ladder type structures. The commercially very successful SAW filters are based on an antiquated topology due to their non-coupled resonator technology.

For realizing frequency-separating filters, diplexers, the SAW filters comprise a too high passband attenuation, which lies at about 0,7 dB with diplexers. Further, SAW filters are not large-signal stable, so that the signal output by a power amplifier would destroy the filter. After the output of the transmit/receive circuit a SAW filter is too expensive.

A balanced transformer has too little selection properties compared to a SAW filter, so that its use is not advantageous either.

Regarding the realizations for band-pass filters known in the art it can be summarised, that they are too expensive to realize, comprise a too high loss in the passband and/or a too low selection property.

U.S. Pat. No. 1,848,221 describes a filter circuit that consists of a serial inductivity, from a series coil and from two parallel branches, which respectively consist of a serial circuit, from an inductivity and a capacitor. The filter is connected between an input circuit and an output circuit, wherein the coils are coupled to each other in the parallel branches.

JP 613706A describes a band-pass filter which comprises an LC series resonance circuit which is connected in series with another LC series resonance circuit. An LC parallel resonance circuit is connected between the connection of the two LC series resonance circuits and ground. The inductivities used in the LC series resonance circuits are coupled to each other.

In the article by Orlov A. T., "Use of active Networks to widen the spectrum of application of piezoelectric filters", in "Frequency Control Symposium, 1994, Proceedings of the 1994 IEEE. International Boston, Jun. 1, 1994, pages 411 to 414" the design of active BAW piezoelectric filters is described whose properties are not obtainable with inductivity-free passive piezoelectric filters.

SUMMARY OF THE INVENTION

It is the object of the present invention to provide an improved filter arrangement, which comprises a low passband attenuation, is large-signal stable and comprises good selection properties.

The present invention provides a new class of filters, in particular band-pass filters, that are suitable for symmetric, asymmetric and even mixed-symmetric input and output lines.

The present invention provides a filter arrangement having a first resonator circuit connected between a first node and a second node; a second resonator circuit connected between a third node and a fourth node, wherein the first resonator circuit and the second resonator circuit are coupled electro-magnetically; and an inductive device connected between the first node and the third node; and a further inductive device connected between the second node and the fourth node; wherein the first resonator circuit and the second resonator circuit include line resonators, BAW resonators, SAW resonators, dielectric resonators, quartz resonators and/or optical resonators.

In accordance with a second aspect the invention provides a filter arrangement having a first resonator circuit, connected between a first node and a second node; a second resonator circuit connected between the second node and a third node, wherein the first resonator circuit and the second resonator circuit are electro-magnetically coupled; an inductive device connected between the second node and the fourth node; a third resonator circuit, connected between a fifth node and the fourth node; and a fourth resonator circuit connected between a sixth node and the fourth node, wherein the third resonator circuit and the fourth resonator circuit are electro-magnetically coupled; wherein the first resonator circuit and the second resonator circuit include line resonators, BAW-resonators, SAW-resonators, dielectric resonators, quartz resonators and/or optical resonators.

In a preferred embodiment a new approach is pursued, according to which the concentrated devices are used with uncoupled and coupled lines, whereby very selective band-pass filters arise, that may be realized with a very low number of devices on a very restricted area.

Apart from these obviously very large advantages for pure band-pass filter functions the present invention further offers topologies with the use of which filters with an unbalanced input gate and a balanced output gate and/or a balanced input gate and an unbalanced output gate can be realized. These filters do not comprise more losses than filters with the same input and output gates due to their concept. With these filters it is possible to save losses and costs that occur with many applications due to the otherwise necessary balanced transformers (Baluns).

In another preferred embodiment the inventory filters are comprised of at least two coupled lines or resonators and one capacitor or one coil. According to the present invention topologies for coupled serial and parallel resonators are provided.

In another preferred embodiment of the present invention a circuit topology for a band-pass filter is provided comprising resonators of which at least two are intercoupled and one or more inductive devices. According to a further embodiment a circuit topology for a band-pass filter is created comprising high-frequency line pairs and one or more inductive devices, wherein the high-frequency line pairs comprise low-impedance and high-impedance lines, wherein at least two high-impedance lines are electromagnetically coupled over a partial length.

A first embodiment relates to a band-pass filter with an input and an output of one unbalanced microwave gate each. Behind the input gate preferably n (n=1, 2, ...) Γ elements are provided. Each of the Γ-elements includes one resonator or one high-frequency line pair which are short-circuited at their ends, wherein the high-frequency line pair comprises a low-impedance and a high-impedance line with an electrical length of smaller than $\lambda/4$, wherein $\lambda$ designates the wavelength of the wave travelling on the high-frequency line. Further, a serial inductive device is provided. In front of the output port a further resonator or a further high-frequency line pair are located, and the further resonator and/or the further high-frequency line pair are connected to the resonator or the high-frequency line pair at the input port via the serial inductive device. The high-frequency line pair includes a low-impedance and a high-impedance line having an electrical length of less than $\lambda/4$ and terminates with a short-circuit at the end.

A second embodiment relates to a band-pass filter with an input and an output of one balanced microwave port each. After the input port n(n=1, 2, ...) C-elements are provided. Each of the C-elements includes one resonator or one high-frequency line pair each comprising two low-impedance and one high-impedance line having an electrical length of less than $\lambda/4$, wherein the low-impedance lines are connected to the balanced ports and/or lines. For each balanced line branch one serial inductive device is provided. In front of the output port a further resonator or a further high-frequency line pair is provided, each comprising two low-impedance and one high-impedance line having an electrical length of less than $\lambda/4$, wherein the low-impedance line is connected to the balanced lines.

A third embodiment relates to a band-pass filter with an input and an output of one unbalanced and one balanced microwave port. After the input port n (n=1, 2, ...) C-elements are locate d. The C-elements include one resonator or one high-frequency line pair, each comprising two low-impedance and one high-impedance line having an electrical length of less than $\lambda/4$, wherein the high-frequency line pair is respectively interconnected to the low-impedance lines with balanced lines. Further, for each balanced line branch a serial inductive device is provided. In front of the output port a further resonator or a further high-frequency line pair is located, respectively comprising two low-impedance and one high-impedance line having an electrical length of less than $\lambda/4$, wherein with the further high-frequency line pair the low-impedance lines are respectively connected to the lines.

A fourth embodiment relates to a band-pass filter having an input and an output of one unbalanced microwave port each. After the input port n (n=1, 2, ...) L-elements are provided. The L-elements include one resonator connected in series or one high-frequency line pair connected in series, comprising one coupled low-impedance and one high-impedance line having an electrical length of less than $\lambda/4$. After a series element an inductive device is located, connected against a reference potential, e.g. ground. In front of the output port a further resonator or a high-frequency line pair is located, comprising a coupled low-impedance and a high-impedance line having an electrical length of less than $\lambda/4$ and being inserted serially between the last inductive device, e.g. the last coil, and the output.

A fifth embodiment relates to a band-pass filter having an input and an output of one balanced microwave port each.

After the input port n(n=1, 2, . . . ) mirrored C-elements are located. The C-elements each include two series elements in the form of two resonators or high-frequency line pairs, each comprising one coupled low-impedance and one high-impedance line having an electrical length of less than λ/4. Further, an inductive device is provided, connected between the balanced line branches. In front of the output port two further series elements are located, in the form of two resonators or in the form of high-frequency line pairs each comprising one coupled low-impedance line and one high-impedance line having an electrical length of less than λ/4.

A sixth embodiment relates to a band-pass filter having an input and an output of one unbalanced and one balanced microwave port. After the input port n (n=1, 2, . . . ) mirrored C-elements are located. The C-elements each include two series elements in the form of two resonators or in the form of high-frequency line pairs each comprising one coupled low-impedance and one high-impedance line having an electrical length of less than λ/4. Those series elements which are not connected to the balanced port are connected against a reference potential, like e.g. ground. An inductive device is connected between the balanced line branches. In front of the output port two further series elements in the form of two resonators or in the form of high-frequency line pairs are located each comprising one coupled low-impedance line and one high-impedance line having an electrical length of less than λ/4.

It is an advantage of the present invention, that due to the inventive band-pass filter, which is for example realized as an LDC resonator band-pass filter (LDC=Lumped Distributed Coupled), a high integrated diplexer (frequency separating filter) is realizable, that meets the required properties regarding transmission loss and selection properties including a power compatibility of 36 dBm in the handset device.

A further advantage of the present invention is that it allows synthesising a band-pass filter that carries out a mode conversion between an unbalanced and a balanced power mode apart from its outstanding selection properties. If this filter is realized with coupled lines in a ceramics a very high packing density is achieved on the one hand due to the low number of line elements and on the other hand due to the fact, that the lines are coupled and therefore lie very close together.

According to another advantage of the present invention it is possible to clearly improve resonator filters of high quality, like e.g. SAW filters using the inventive topology, so that the number of required resonator is lower with the same blocking isolation and therefore the costs for realization are decreased apart from a simultaneous decrease of transmission losses. If a mode conversion is necessary, no 180° line is necessary any more according to the present invention. The present invention therefore opens the possibility to realize band-pass filters with mode conversion properties using other high grade resonators, like e.g. using crystal resonators and bulk acoustic wave resonators.

As no additional lines are necessary according to the present invention and as the phase accuracy of a resonator is better than that of a short acoustic line, in principle lower transmission losses result for filters according to the present invention.

According to another advantage of the present invention a topology for a filter with balanced inputs and outputs is provided.

BRIEF DESCRIPTION OF THE DRAWINGS

Preferred embodiments of the present invention are described in more detail making reference to the enclosed drawings, in which.

DESCRIPTION OF THE PREFERRED EMBODIMENTS

Figure 1:
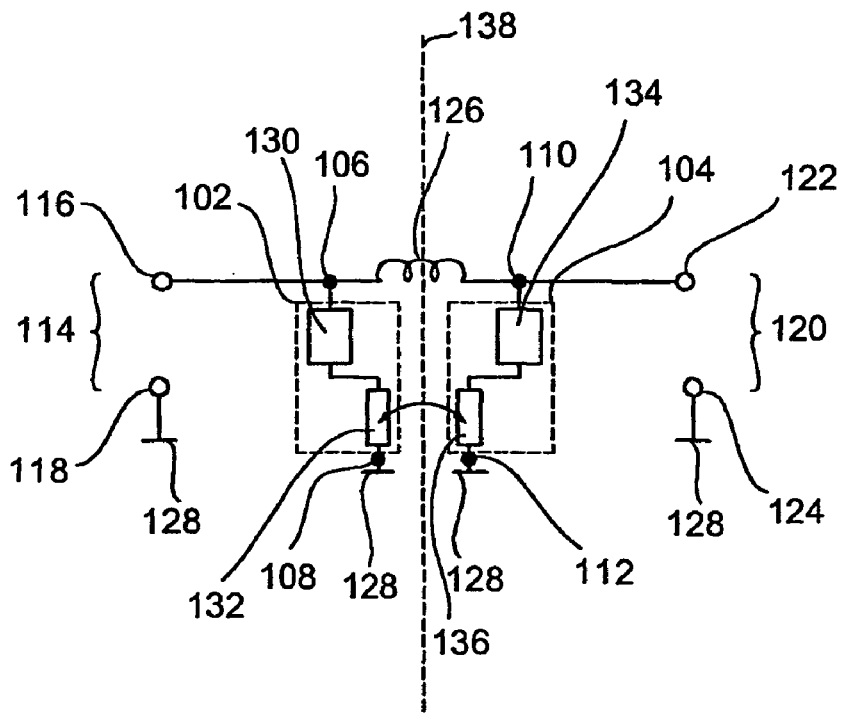
FIG. 1 shows an LDC resonator band-pass filter with parallel resonators with an unbalanced input and output port in-line technology.

FIG. 1 shows a resonator band-pass filter according to a first embodiment of the present invention with an unbalanced input and output. The resonator band-pass filter includes a first resonator circuit 102 and a second resonator circuit 104. The first resonator circuit 102 is connected between a first node 106 and a second node 108. The second resonator circuit 104 is connected between a third node 110 and a fourth node 112. The resonator band-pass filter further includes an input port 114 including a first input port node 116 and a second input port node 118. Further, an output port 120 is provided including a first output port node 122 and a second output port node 124. Further, the resonator band-pass filter includes an inductive device 126, e.g. in the form of a coil, connected between the first node 106 and the third node 110.

In the embodiment shown in FIG. 1 the first input port node 116 is connected to the first node 106 and the first output port node 122 is connected to the third node 110. The second node 108, the fourth node 112, the second input port node 118 and the second output port node 124 are connected to a reference potential 128, e.g. ground.

The embodiment shown in FIG. 1 illustrates the topological construction according to the present invention for the case, that the input 114 and the output 120 are respectively formed by an unbalanced microwave port. A large number of line systems used in practice, like e.g. coaxial lines, micro strip lines and strip lines are unbalanced systems. In FIG. 1 a simple realization is shown using coupled high-frequency lines. The first resonator circuit 102 includes a first high-frequency line 130 and a second high-frequency line 132 serially connected between the first node 106 and the second node 108. The second resonator circuit includes a third high-frequency line 134 and a fourth high-frequency line 136, serially connected between the third node 110 and the fourth node 112.

As is shown in FIG. 1, the line pair comprised of the high-frequency lines 130 and 132 is arranged in parallel to the input port 114 and is therefore connected between the input port node 116 of the input port 114 and/or the first node 106 and ground 128, wherein the high-frequency lines each comprise an electrical length of less than $\lambda/4$, wherein $\lambda$ is the wavelength of the waves travelling on the lines. The first high-frequency line 130 comprises an optimized low-impedance wave resistance $Z_{130}$ and is coupled with no other line. The first high-frequency line 130 has a capacitive effect. Instead of the realization of the high-frequency line 130 shown in FIG. 1 it can also be implemented as an idling, short tap-line, whose non-idling end is connected to the node 106, wherein in this case the input of the second high-frequency line 132 is simultaneously connected to the node 106.

The second high-frequency line 132 has an optimized high-impedance wave resistance $Z_{132}$, which is usually different from the wave resistant $Z_{130}$ of the first high-frequency line. The second high-frequency line 132 is electromagnetically coupled to the fourth high-frequency line 136, as it is indicated by the arrow in FIG. 1.

The third high-frequency line 134 and the fourth high-frequency line 136 are arranged in parallel to the output port 120 and are therefore arranged between the output port node 122 of the output port 120 and/or the third node 110 and ground 128. Between the two ports 114 and 120 the inductive device 126 is arranged between the nodes 106 and 110. The inductive device can be realized as a concentrated device, e.g. as a SMD device (SMD=Surface Mounted Device), or as a line device.

Assuming that the two microwave ports 114 and 120 have the same reference impedance, the third high-frequency line 134 must correspond to the first high-frequency line 130 regarding wave resistance and electrical length. The same is true for the high-frequency lines 132 and 136. In this case the filter circuit must be mirror symmetric with regard to the center axis 138. The inventive filter for impedance transformation can be used with any reference impedance at both ports 114 and 120, wherein in this case the symmetry properties are not given any more. Using the filter e.g. a high integrated diplexer can be realized.

In order to achieve better selection properties using the filter of FIG. 1 additional serial inductive devices and line pairs are to be inserted alternatingly, which are interconnected to the reference potential. However, not all high-impedance lines of the line pairs need to be coupled to each other. The larger the part of coupled lines, the better the selection properties.

Instead of the capacitively operating high-frequency lines 130 and 135 concentrated capacitors may also be used, connected between the nodes 106 and/or 110 and the reference potential 128, wherein in this case the second high-frequency lines 132 and 136 are directly connected to the first node 106 and/or 110.

Instead of the line pairs shown in FIG. 1 also any other resonators may be used, as far as they can be intercoupled and show a parallel resonance, i.e. a blocking performance, in the passband. Examples of such resonators are surface acoustic wave resonators (SAW resonators), crystal resonators, bulk acoustic wave resonators and similar things.

Figure 2:
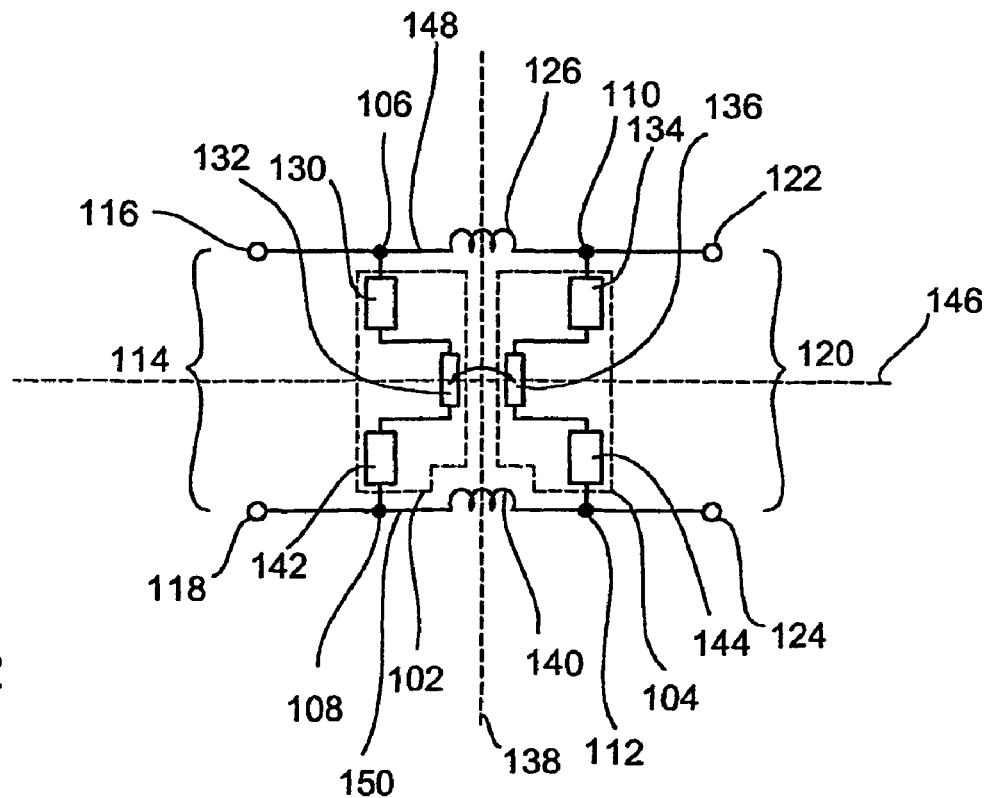
FIG. 2 shows an LDC resonator band-pass filter with a balanced input and output port in-line technology.

In FIG. 2 a resonator band-pass filter according to a further embodiment of the present invention is shown having a balanced input/output. In FIG. 2 components described referring to FIG. 1 are designated with like reference numerals.

In the embodiment shown in FIG. 2, the second input port node 118, the second node 108, the fourth node 112 and the second output port node 124 are not connected to a reference potential, in contrast to FIG. 1. Rather, the first input port node 118 is connected to the second node 108 and the second output port node 124 is connected to the fourth node 112. Additionally, a further inductive device 140 is arranged between the second-node 108 and the fourth node 112. Further, the first resonator circuit 102 additionally includes a fifth high-frequency line 142, wherein the high-frequency lines 130, 132 and 142 of the first resonator circuit 102 are connected between the first node 106 and the second node 108. Likewise, the second resonator circuit 104 includes a further, sixth high-frequency line 144. The high-frequency lines 134, 136 and 144 of the second resonator circuit 104 are serially connected between the third node 110 and the fourth node 112.

In FIG. 2, a band-pass filter is shown, wherein the input port 114 and the output port 120 respectively are a balanced microwave port. The filter topology in this case is such, that after the input port 114 two line pairs connected in series are provided, comprising the capacitive high-frequency line 130, the double inductive line 132 and the additional capacitive line 142, wherein the second high-frequency line 132 has a length of about $\lambda/2$ in this embodiment. Further, the illustrated topology comprises the two serial inductive devices 126 and 140 and the additional double line pair consisting of the high-frequency lines 134, 136 and 144, formed by two capacitive lines 134 and 144 and one inductive line 136 with a length of about $\lambda/4$, similar to the lines 130, 132 and 142. The inductive lines 132 and 136 are electromagnetically coupled, as it is indicated by the arrow in FIG. 2. The first high-frequency line 130, the fifth high-frequency line 142, the third high-frequency line 134 and the sixth high-frequency line 144 are low-impedance lines, whereas the second high-frequency line 142 and the fourth high-frequency line 136 are high-impedance lines.

The special thing about the topology illustrated in FIG. 2 is, that it is mirror symmetric with regard to the horizontal center axis 146, i.e., that e.g. the inductive devices 126 and 140, for example formed by coils, and also the high-frequency lines 130 and 142 and/or the high-frequency lines 134 and 144 are equal in their electric performance.

Assuming that the two ports 114 and 120 comprise an identical reference impedance, the filter circuit with respect to the vertical center axis 138 is mirror symmetric, i.e., the third high-frequency line 134 corresponds to the first high-frequency line 130 with regard to its wave resistance and its electrical length. The same is true for the second high-frequency line 132 and the fourth high-frequency line 136, for the fifth high-frequency line 142 and the sixth high-frequency line 144 and for the coils 126 and 140.

The filter can be used for an impedance transformation at any port impedances, wherein in this case the symmetry properties are not given any more.

If it is desired to improve the selection properties of the filter arrangement in FIG. 2, additional serial inductive devices and line paths are to be provided alternatingly, connected between the balanced lines 148 and 150, connecting the respective input port nodes to the respective output port nodes.

It is not necessary for all high-impedance lines to be intercoupled, but the selection properties are the better, the higher the proportion of intercoupled lines.

Instead of the capacitively operating high-frequency lines 130 and 134 and 142 and 144, concentrated capacitors may also be provided, connected between the signal line and ground. In this case the second high-frequency line 132 and the fourth high-frequency line 136 are directly connected to the first node 106 and the second node 108 and/or the third node 110 and the fourth node 112.

Instead of the above described intercoupled line pairs, also any other resonators may be used, as long as they can be intercoupled and have a parallel resonance (blocking performance) in the passband.

Figure 3:
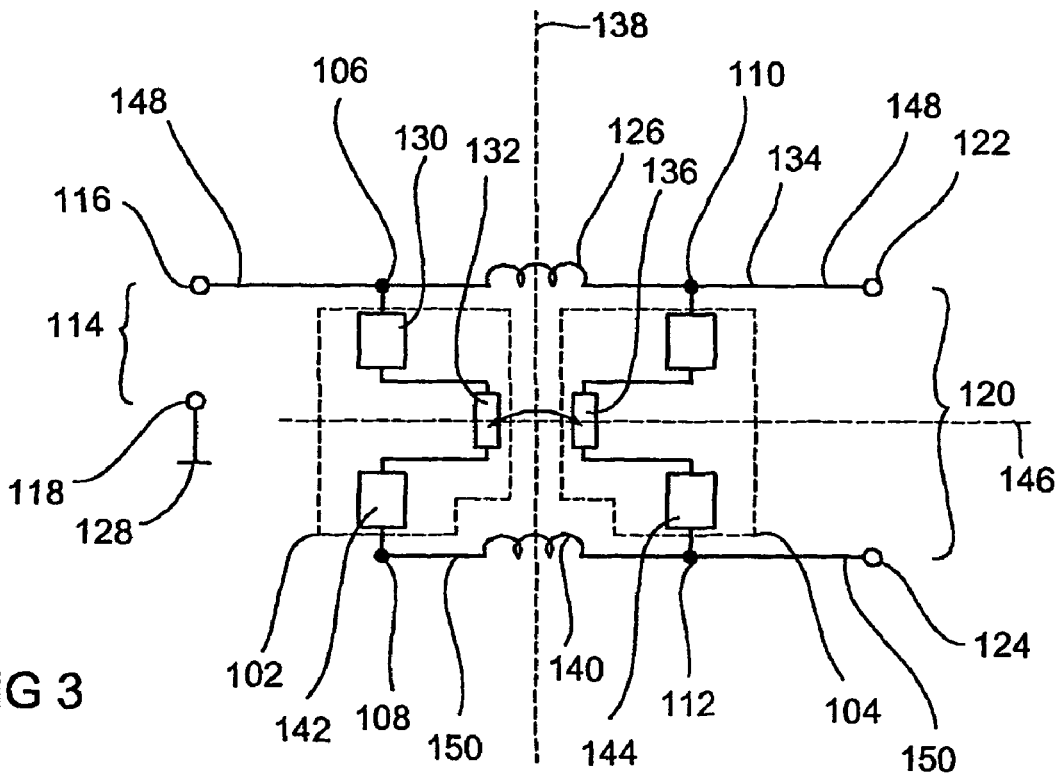
FIG. 3 shows an LDC resonator band-pass filter with parallel resonators having an unbalanced input port and a balanced output port in-line technology.

In FIG. 3 a resonator band-pass filter with a balanced and an unbalanced port is shown, wherein the elements already described in the preceding Figs. are designated like reference numerals.

In contrast to FIG. 2, the second input port node 118 of the input port 114 is connected to a reference potential 128, e.g. ground, in this embodiment of the band-pass filter. The second node 108 is only connected to the second output port node 124 via further inductive devices 140.

The band-pass filter shown in FIG. 3 illustrates the case, wherein the input port 114 is an unbalanced port and the output port 120 is a balanced port. In this case the filter topology is, that after the input port 114 two line pairs connected in series are provided as a first resonator circuit 102 and an additional dual line pair as a second resonator circuit 104, connected by the two serial inductive devices 126 and 140. The line pairs of the first resonator circuit 102 and the second resonator circuit 104 each include a first capacitive high-frequency line 130 and/or 134, a double inductive high-frequency line 134 and/or 136 having an approximate length of $\lambda/2$, and an additional capacitive high-frequency line 142 and/or 144.

The special thing about this topology is, that the filter circuit is mirrorsymmetric with regard to the horizontal center axis 146. The filter shown in FIG. 3 can be used for an impedance transformation for any port impedances, wherein the symmetry property with reference to the vertical axis 138 are not given any more in this case.

If the filter properties, e.g. the selection properties of this filter are to be improved, additional serial inductive devices and double line pairs are to be provided alternatingly, which are to be connected between the balanced lines 148 and 150. Although not all high-impedance lines need to be intercoupled, the selection properties improve with an increasing number of intercoupled lines . . .

Instead of the capacitive and intercoupled lines also any other resonators may be used that may be intercoupled and comprise a parallel resonance in the passband.

Figure 4:
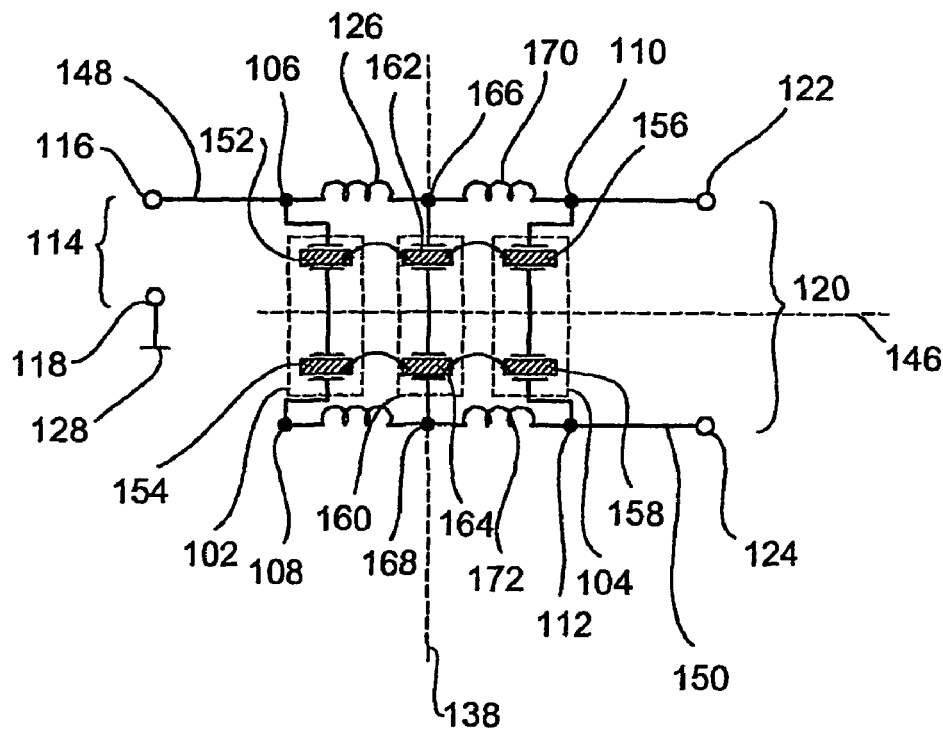
FIG. 4 shows a resonator band-pass filter having an unbalanced input port and a balanced output port with coupled resonators.

Such an arrangement is shown exemplary in FIG. 4, where the first resonator circuit 102 comprises a first resonator 152 and a second resonator 154, serially connected between the first node 106 and the second node 108. The second resonator circuit 104 includes a third resonator 156 and the fourth resonator 158, serially connected between the third node 110 and the fourth node 112. Additionally a third resonator circuit 160 is provided in the embodiment shown in FIG. 4, including a fifth resonator 162 and a sixth resonator 164, serially connected between a fifth node 166 and sixth node 168. Additionally, further inductive devices 170, 172 are provided, connected between the third node 110 and the fifth node 166 and/or between the fourth node 112 and the sixth node 168. As it is indicated by the arrows in FIG. 4, the individual resonators are intercoupled. Alternatively, the third resonator circuit 160 and the additional inductive devices 170 and 172 may be omitted, and in this case an arrangement similar to that of FIG. 3 results, wherein the resonator circuit shown in FIG. 4 are used with the two respective resonators, which are respectively intercoupled, instead of the high-frequency lines shown in FIG. 4.

The way of intercoupling resonators, which is generally an energy coupling, fully depends on the way of realizing the resonator. If, e.g., SAW resonators are used, the coupling is effected via acoustic waves. The coupling coefficients are to have an optimized absolute magnitude and phase value, wherein their value range may be varied by a provision of coil values.

Figure 5:
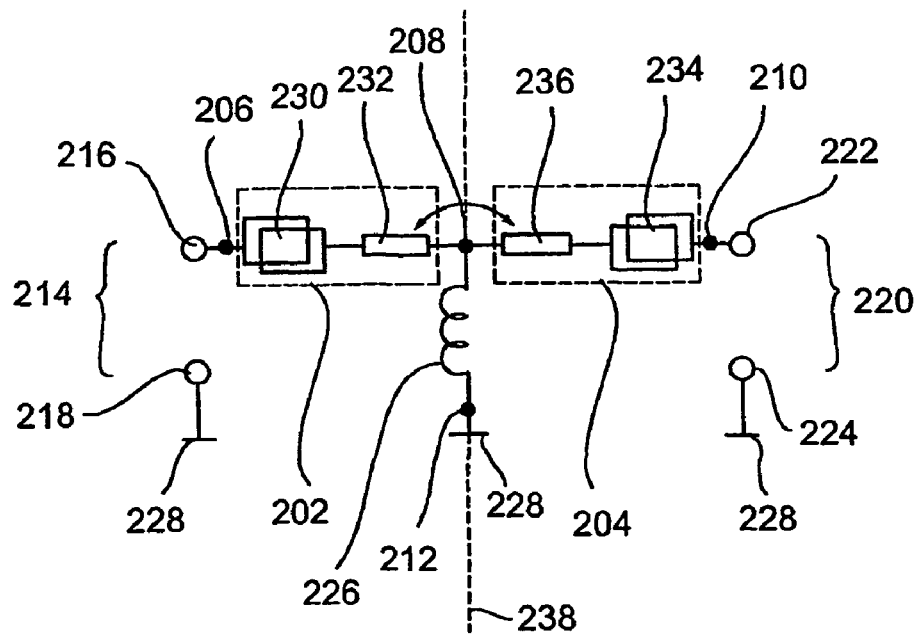
FIG. 5 shows a resonator band-pass filter having series resonators with an unbalanced input and output port in-line technology.
Figure 6:
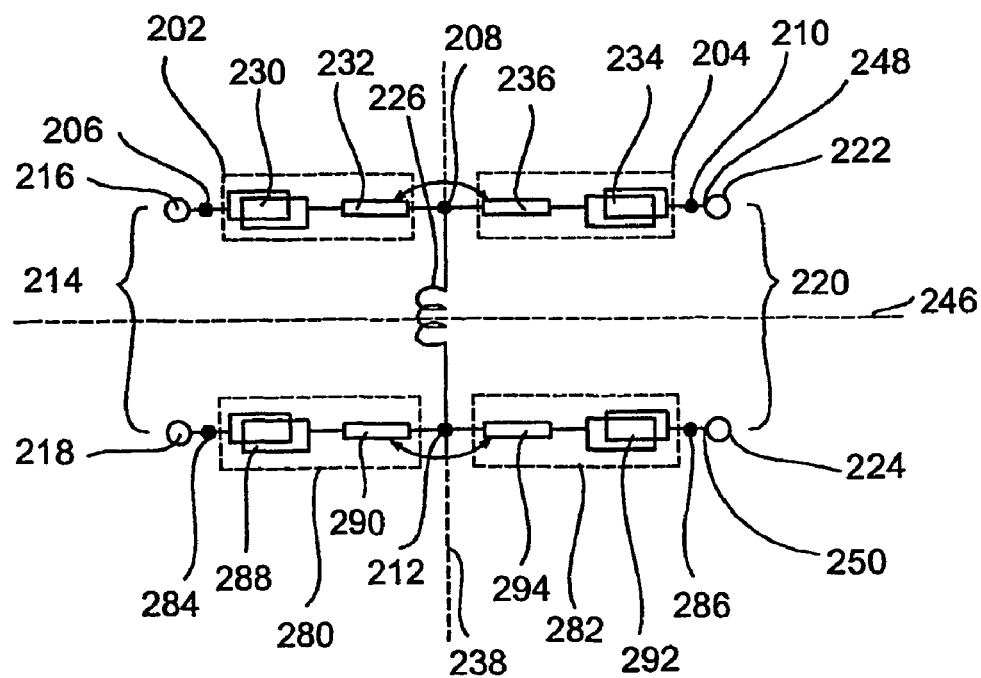
FIG. 6 shows a resonator band-pass filter having series resonators with a balanced input and output port in-line technology.
Figure 7:
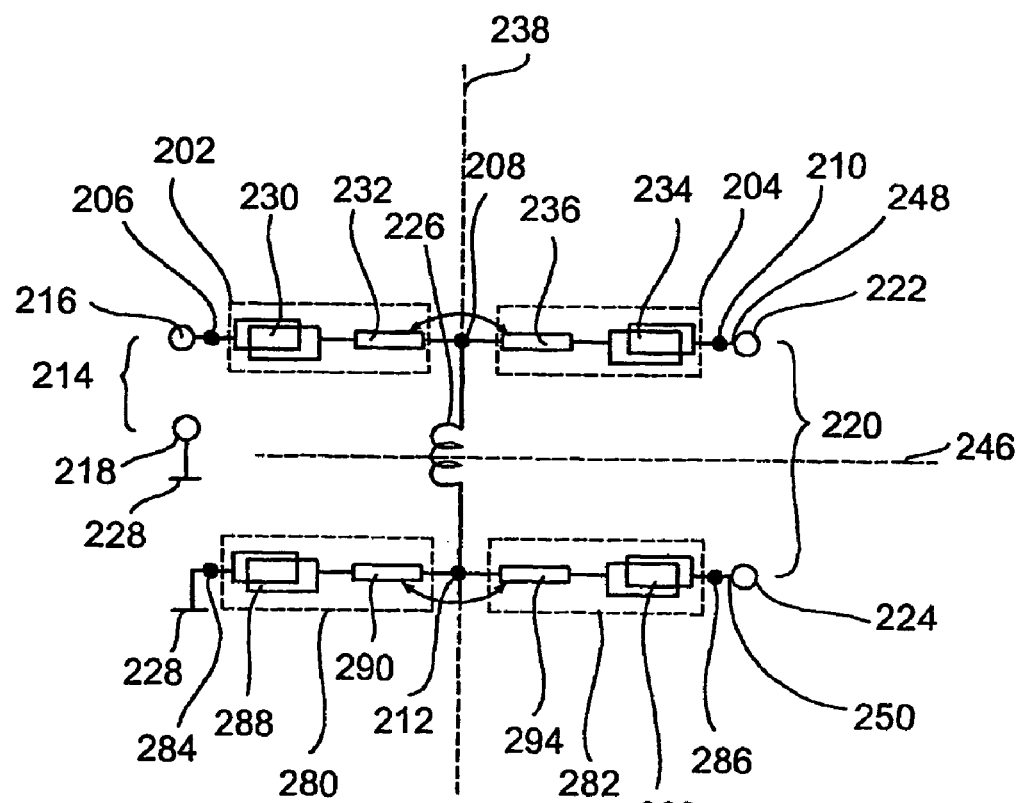
FIG. 7 shows a resonator band-pass filter having an unbalanced input port and a balanced output port in-line technology.

Referring to FIGS. 1 to 4 embodiments for preferred resonator band-pass filters were described above, wherein the resonator circuit have a parallel resonance in the passband. In the following, preferred embodiment of resonator band-pass filters are described referring to FIGS. 5 to 7, having a serial resonance (passage performance) in the passband. Referring to FIGS. 5 to 7 so-called complementary structures are discussed for the filters described referring to FIGS. 1 to 3.

In FIG. 5 a resonator band-pass filter is shown including a first resonator circuit 202 and a second resonator circuit 204. The first resonator circuit is connected between a first node 206 and a second node 208. The second resonator circuit 204 is connected between the second node and a third node 210. Further, the filter arrangement includes a fourth node 212. An input port 214 includes a first input port node 216 connected to the first node 206 and a second input port node 218. An output port 220 includes a first output port node 222 connected to the third node 210, and a second output port node 224. Between the second node 208 and the fourth node 212 an inductive element 226 is arranged, e.g. in the form of a coil. The fourth node 212 and the second input port node 218 and the second output port node 224 are connected to a reference potential 228, e.g. ground. The first resonator circuit includes a first high-frequency line 230 and a second high-frequency line 232, serially connected between the first node 206 and the second node 208. The second resonator circuit 204 includes a third high-frequency line 234 and a fourth high-frequency line 236 serially connected between the third node 210 and the second node 208.

In FIG. 5 the topological construction is shown for the case, that the input 214 and the output 220 are each an unbalanced microwave port. In FIG. 5 a simple realization is illustrated using coupled high-frequency lines. After the input 214 the coupled low-impedance high-frequency line 230 is provided, wherein the electrical length of the coupled lines are smaller than $\lambda/4$. Further, a high-impedance line 132 is provided with an electrical length of less than $\lambda/4$. In front of the output 220 a coupled low-impedance line 234 and a high-impedance line 236 are provided, wherein their length corresponds to the length of the lines 230 and 232. The coil 226 is connected against the reference potential 228 between the line pairs.

The high-frequency line 230 has a capacitive effect. The second high-frequency line 232 comprises an optimized wave resistance $Z_{232}$, that is generally different from the wave resistance $Z_{230}$ of the first high-frequency line 230 in that it is of a higher impedance. The second high-frequency line 232 further comprises an optimized length and is electromagnetically coupled to the fourth high-frequency line 236.

The high-frequency lines 234 and 236 preferably correspond to the high-frequency lines 230 and 232 with respect to their length and their wave resistance. The high-frequency lines 234 and 236 are located between the output port 224 and the second node 208 and the inductive device 226 is located between the high-frequency lines 232 and 236, interconnected against the reference potential 228 and e.g. realized as a line device or a concentrated device, wherein in this case the inductive device is realized as an SMD device (SMD=Surface Mounted Device).

Assuming that the two terminal ports 214 and 220, that may e.g. be microwave ports, have the same reference impedance, the first high-frequency line 230 must correspond to the third high-frequency line 234 regarding its wave resistance and its electrical-length. The same is true for the high-frequency lines 232 and 236. In this case the filter circuit must be mirrorsymmetric with reference to the vertical center axis 238.

The filter circuit can be used for impedance transformation with any reference impedances of the two ports 214 and 220, wherein in this case the symmetry properties are not present any more.

As far as an improvement of selection properties of the filter arrangement shown in FIG. 5 is desired, additional series lines and inductive devices connected to ground need to be inserted alternatingly. Although not all high-impedance lines need to be intercoupled, an improvement of selection properties results with an increasing amount of intercoupled lines.

Regarding the high-frequency lines 230, 232, 234 and 236 provided in the resonator circuit 202 and 204 it is noted, that the lines may also be arranged in reverse order compared to FIG. 5. Further, any resonator circuit may include any number of coupled and/or non-coupled high-frequency lines.

Instead of the lines described in FIG. 5 also any other resonators may be used, as far as they can be intercoupled and comprise a series resonance (passage performance) in the passband. The topology shown in FIG. 5 is a so-called complementary structure to the structure described in FIG. 1.

Referring to FIG. 6 a further embodiment of a filter arrangement is described, wherein both ports 214 and 220 are balanced ports compared to FIG. 5. The arrangement shown FIG. 6 includes a third resonator circuit 280 and a fourth resonator circuit 282 in the balanced line 250 in parallel to the balanced line 248. The third resonator circuit 280 is connected between the fourth node 212 and a fifth node 284, and the fourth resonator circuit 282 is connected between the fourth node 212 and a sixth node 286. The fifth node 284 is connected to the second input port node 280 and the sixth node 286 is connected to the second output port node 224.

The third resonator circuit 280 includes a fifth high-frequency line 288 and a sixth high-frequency line 290 arranged serially between the fifth node 284 and the second node 212. The fourth resonator circuit 282 includes a seventh high-frequency line 292 and an eighth high-frequency line 294 connected serially between the sixth node 286 and the fourth node 212. As is indicated by the arrow in FIG. 6, the high-frequency lines 290 and 294 are intercoupled electromagnetically.

FIG. 6 shows a passband filter arrangement wherein the input and output ports 214 and 220 respectively are a balanced port, e.g. a microwave port. In this case the filter topology is, that after the input port 214 two double series lines with a length of less than λ/4 are connected, herein formed by the lines 230, 232, 288 and 290. Further, the parallel inductive device 226 and two additional line pairs are provided, formed by the high-frequency lines 234, 236, 292 and 294. The special thing about this topology is, that the filter circuit is mirrorsymmetric with regard to the horizontal center axis 246, i.e. the lengths and the wave resistances of the upper lines 230 to 236 are equal to the lengths and wave resistances of the bottom lines 288 to 294.

Assuming that the two ports 214 and 220 comprise the same reference impedance, the circuit must be mirrorsymmetric referring to the vertical center axis 238 as well, i.e., the high-frequency line 230 corresponds to the high-frequency line 234 with respect to its wave resistance and its electrical length. The same is true for the high-frequency lines 232, 288, 290, corresponding to the high-frequency lines 236, 292 and 294 regarding their wave resistances and their electrical length.

The filter arrangement can be used for impedance transformation at any port impedances, wherein in this case the above-mentioned symmetry properties are not given any more.

If an improvement of the selection properties of the filter arrangement is to be achieved, additional series lines and inductive devices connected between the balanced lines 248 and 250 must be inserted alternatingly. Although not all lines need to be intercoupled, the selection properties may be improved with an increasing part of intercoupled lines.

The line order in the individual resonator circuit 202, 204, 280 and 282 shown in FIG. 6 may also be interchanged. Further, any amounts of coupled and/or incoupled high-frequency lines may be provided in the resonator circuit.

Instead of the coupled lines described in FIG. 6 also any other resonators may be used, as far as they may be intercoupled and have a series resonance (a passage performance) in the passband.

In FIG. 7, a further embodiment of a resonator bandpass filter is presented, wherein the input port is an unbalanced port and the output port is a balanced port.

Essentially, the structure of the circuit of FIG. 7 corresponds to that of FIG. 6, wherein here, however, in contrast to FIG. 6, the second input port node 218 is connected to the reference potential 228, e.g. ground. Further, the fifth node 284 is connected to the reference potential 228. In other words, only the first balanced line 248 extends between the input port and the output port, in contrast to FIG. 6, wherein the second balanced line 250 extends from the second output port node 224 to the reference potential 228 via the nodes 286, 212 and 284.

With the bandpass filter illustrated in FIG. 7, the input terminal 214 is an unbalanced port and the output terminal 220 is a balanced port. The filter topology in this case is, that after the input port 214 two line pairs (high-frequency lines 230, 232, 288, 290), a parallel inductive device 226 and two further line pairs (high-frequency lines 232, 236, 292, 294) are connected.

The special thing about this topology is, that the filter circuit is mirrorsymmetric with regard to the horizontal central axis 246, i.e., the upper lines 230 to 236 and the lower lines 288 to 294 are equal regarding their electrical performance, their wave length and their electrical lengths.

Assuming that the impedance of the input port 214 corresponds to half of the impedance of the output port 220, the high-frequency line 230 must correspond to the high-frequency line 234 regarding its wave resistance and its electrical length. The same is true for high-frequency lines 232, 288 and 290, that need to correspond to the high-frequency lines 236, 292 and 294 with regard to the electrical properties. The circuit must also be symmetric regarding the vertical center axis 238.

Assuming any port impedances at the input port 214 and 220 the filter can be used for impedance transformation, wherein in this case the above mentioned symmetry properties are not given any more.

In order to improve the filter properties, like e.g. the selection properties, additional series lines and inductive devices, connected between the balanced lines 248 and 250 must be inserted alternatingly. Although not all high impedance lines need to be intercoupled, the selection properties of the filter may be improved depending on the number of intercoupled lines.

As with the embodiments described according FIGS. 5 and 6, the order of the high-frequency lines can be reversed at the resonator circuit. Further, the resonator circuit may comprise any number of coupled and/or uncoupled high-frequency lines.

Instead of the coupled lines 230 to 236 and 288 to 294 also all other resonators may be used, as far as they can be coupled and comprise a series resonance (passage performance) in the passband.

With regard to the embodiment described above in more detail referring to FIGS. 1 to 7 it is noted, that it is the case with all filter arrangements that both possible directions may be used for an electromagnetic coupling. Often, these couplings are marked with a point at the device (line or coil). In this case the two points may lie left and/or right or inside and/or outside.

In general it is valid for all above described embodiments, that the input port 114, 214 and the output port 120, 220 may always be interchanged. Instead of the capacitively operating lines concentrated capacities in the form of chip capacitors or similar things may be used, wherein in the case of the embodiment described referring to FIGS. 1 to 3 these capacitors are connected between the signal line and ground, and in the case of the embodiments described referring to FIGS. 5 to 7 these capacitors are interconnected serially.

It is noted, that the described input/output ports must not be microwave ports, but that any port is included in the generally defined network theory. If piezoelectric resonators are used, the inventive topology may also be used with low frequencies. If optical resonators are used the concept may also be used in optics.

The construction of serial lines and/or serial resonators and parallel lines and/or parallel resonators may also be combined together in a chain circuit from the minimal construction stage of the above described basic cells with three elements. Some filters comprise a serial and a parallel resonance that lie very close together, so that a resonator cell for both cases may be used for such filters.

The coupled high-frequency lines 232 and 236 used in the embodiments described in FIGS. 1 to 3 may be halved and the inductive device 246 described in FIGS. 5 to 7 may be replaced by two inductive devices with twice this value, and then they are contacted with ground for the balanced ports in the symmetry plane 246 for the circuits, whereby the balanced line systems are put in a symmetry against ground.

The capacitive lines of the resonator, that is the lines 130, 230, 134, 234, 142, 288 and 144, 292 are advantageously realized by two overlapping, low impedance lines.

Figure 8:
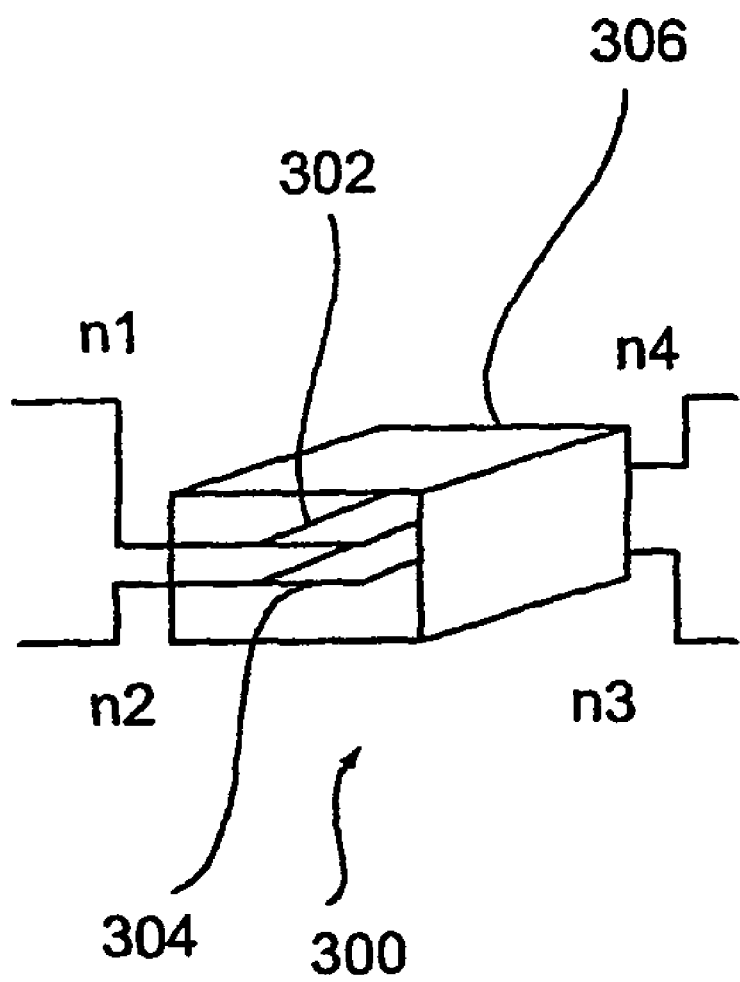
FIG. 8 shows a schematic illustration of the coupled high-frequency lines preferably used in the circuits according to the present invention.

FIG. 8 schematically shows a coupled high-frequency line. Between a first port formed by the terminals n1 and n2 and a second port formed by the terminals n3 and n4 the coupled high-frequency line 300 is arranged. The high-frequency line 300 includes a first line 302 and a second line 304 arranged in parallel, both arranged in an isolated housing 306 connected to a reference potential, e.g. ground. The first line 302 is connected between the terminal n1 and the terminal n4, and the second line 302 is connected between the terminal n2 and the terminal n3. The lines 302 have a length designated "P", a width referred to as "W" and a vertical distance from the walls formed by the housing 306, referred to as S. The lengths and widths of the lines 302 and 304 are preferably equal.

The capacitive lines 130, 230, 134, 234, 142, 288 and 144, 292 of the resonators are realized through lines 302 and 304. With the coupled lines the resonators are high-frequency lines 132, 232 and 290 and are formed by the first line 302 and the high-frequency lines 136, 236 and 294 by the second line 304.

According to an embodiment the band-pass filters described referring to FIGS. 1 to 7 have a passband of approximately 1.7 GHz to approximately 2.0 GHz. The resonators comprise the lines described referring to FIG. 8 and their elements are optimized for this frequency area.

According to an embodiment of the present invention, wherein same impedances are present at the port of the circuits, e.g. 50Ω, the inductivity of the inductive devices used lie between 1 nH and 10 nH, the length of the capacitive lines lies between 0.1 mm and 0.8 mm, the width of the coupled lines lies between 0.1 mm and 0.8 mm, the length of the coupled lines lies between 3.0 mm and 8 mm, and the width of the coupled lines lies between 0.06 mm and 0.2 mm. The distance of the lines from the wall preferably is about 0.02 mm. The capacitive lines at the input and at the output have the same dimensions in this case.

According to a further embodiment of the present invention wherein different impedances are present at the ports of the circuits, e.g. 50Ω and 25Ω, the inductivity of the inductive devices used lies between 1 nH and 10 nH, the length of the capacitive lines lies between 0.1 mm and 0.8 mm, the width of the coupled lines lies between 0.1 mm and 0.8 mm, the length of the coupled lines lies between 3.0 mm and 8 mm and the width of the coupled lines lies between 0.06 mm and 0.2 mm. The distance of the lines from the wall preferably is about 0.02 mm. The capacitive lines at the input and at the output do not comprise the same dimensions in this case.

FIG. 5 is again referred to as an example. It is assumed that the capacitive lines 230 and 234 are respectively formed by one of the lines 300 shown in FIG. 8. The coupled lines 232, 236 are formed by a common line 300 (FIG. 8).

Assuming same impedances of 50Ω at the input port 214 and a at the output port 220 the elements comprise the following optimized values for a passband from 1.71 GHz to 1.99 GHz:

The widths "W" of the lines of the first high-frequency line pair 230 and the widths "W" of the second high-frequency line pair 234 are the same and amount 0.41296 mm. The length "P" of the lines 302, 304 of the first high-frequency line pair 230 and the length "P" of the second high-frequency line pair 234 are the same and amount 0.41296 mm.

The width "W" of the high-frequency line 232 and the width "W" of the second high-frequency line pair are the same and amount to 0.06552 mm. The length "P" of the high-frequency line 232 and the length of the second high-frequency line 236 are the same and amount to 4.169 mm.

The distance of all lines to the wall is 0.02 mm.

The inductive device 226 has an inductivity of 3.1891 nH.

Figure 9A:
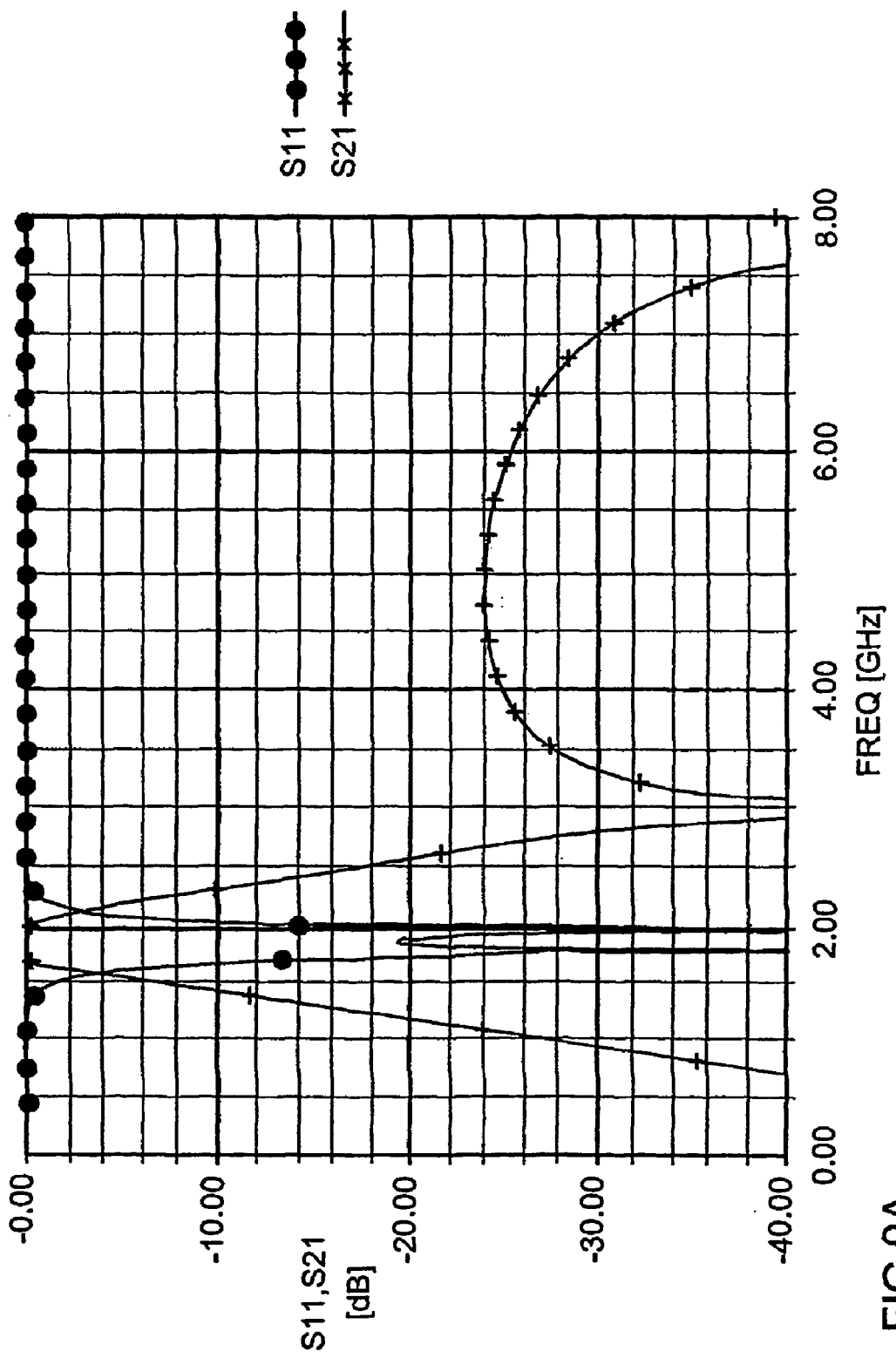
FIG. 9A shows a graph of the reflection factor and passage attenuation for a band-pass filter with an impedance of 50Ω at both ports.

The above values of the elements result from optimising the reflection factor and the passband attenuation in the passband of the filter, with $S_{11}$=−21 dB and $S_{21}$=0 dB in the passband, and $S_{21}$=−22 dB outside the passband. FIG. 9A shows the course of the reflection factor ($S_{11}$) and the passband attenuation ($S_{21}$) over the frequency area from 0 GHz to 8 GHz.

Assuming an impedance of 50Ω at the input port 214 and an impedance of 25Ω at the output port 220 (or the other way round), the elements have the following optimized values for a passband from 1.71 GHz to 1.99 GHz (impedance transformation):

The widths "W" of the lines of the first high-frequency line pair 230 amount to 0.49379 mm, the widths "W" of the lines of the second high-frequency line pair 234 amount to 0.53553 mm. The lengths "P" of the lines 302, 304 of the first high-frequency line pair 230 amount to 0.49379 mm and the lengths "P" of the second high-frequency line pair 234 amount to 0.53553 mm.

The width "W" of the high-frequency line 232 and the width "W" of the second high-frequency line pair are equal and amount to 0.10583 mm. The length "P" of the high-frequency line 232 and the length of the second high-frequency line 236 are equal and amount to 3.576 mm.

The distance of all lines to the wall amount to 0.02 mm.

The inductive device 226 has an inductivity of 2.5432 nH.

Figure 9B:
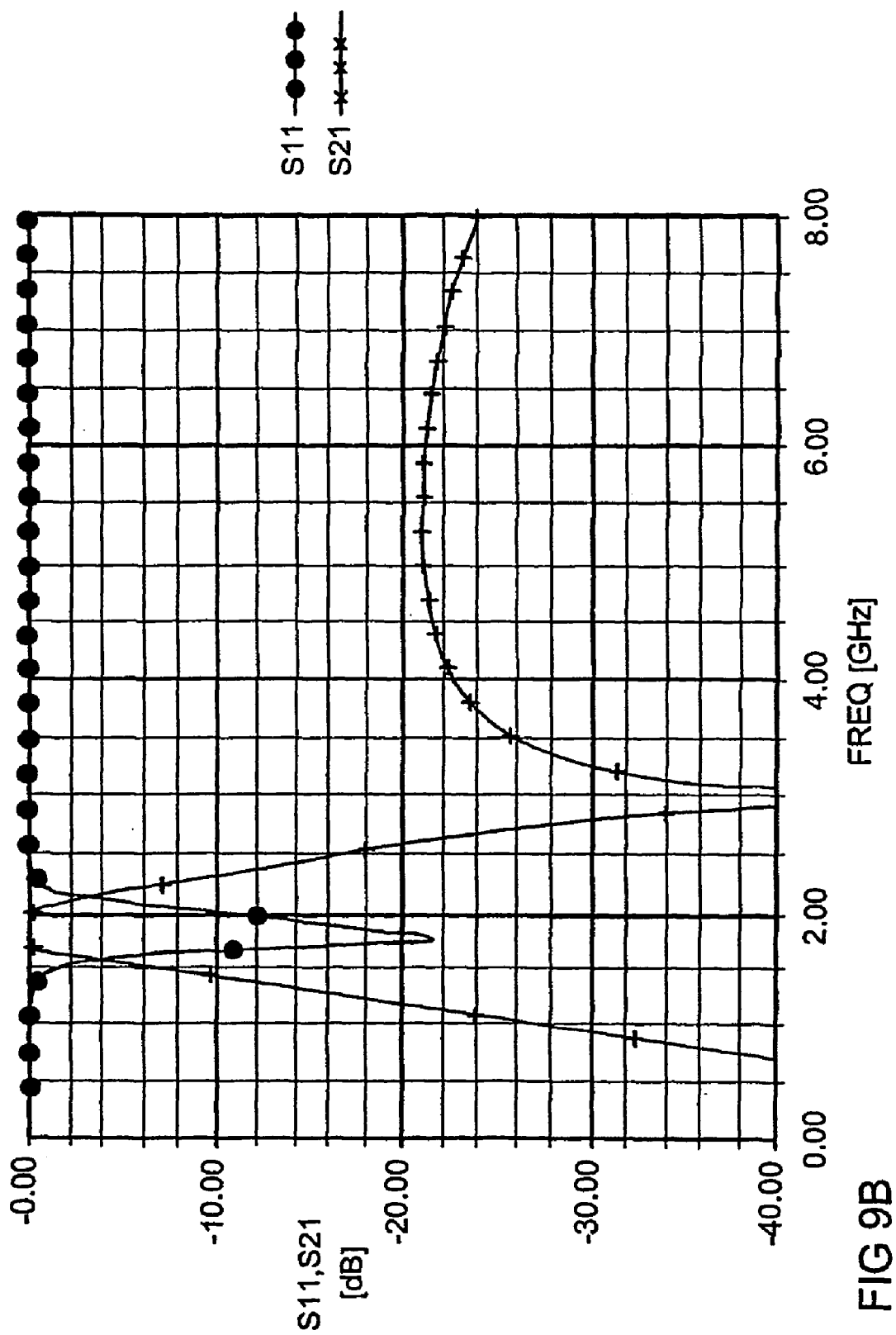
FIG. 9B shows the course of reflection factor and passband attenuation with an impedance of 50Ω at a first port and of 25Ω at a second port.

The above values of the elements result from an optimisation of the reflection factor and the passband attenuation in the passband area of the filter, with $S_{11}=-21$ dB and $S_{21}=0$ dB in the passband, and $S_{21}=-22$ dB outside the passband area. FIG. 9B shows the course of the reflection factor ($S_{11}$) and the passband attenuation ($S_{21}$) over the frequency area from 0 GHz to 8 GHz.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A filter arrangement, comprising
a first resonator circuit connected between a first node and a second node;
a second resonator circuit connected between a third node and a fourth node, wherein the first resonator circuit and the second resonator circuit are coupled electro-magnetically or acoustically; and
an inductive device connected between the first node and the third node,
wherein a further inductive device is connected between the second node and the fourth node;
wherein each of the first resonator circuit and the second resonator circuit includes at least one of a line resonator, a BAW resonator, a SAW resonator, a dielectric resonator, a quartz resonator and an optical resonator.

2. The filter arrangement according to claim 1, wherein the first resonator circuit and the second resonator circuit define a passband, have a parallel resonance in the passband, and are coupled.

3. The filter arrangement according to claim 1, further comprising a first port with a first port node connected to the first node, and a second port node connected to the second node, a second port with a third port node connected to the third node, and a fourth port node connected to the fourth node.

4. The filter arrangement according to claim 1, further comprising a first port with a first port node connected to the first node, and a second port node connected to a reference potential, a second port with a third port node connected to the third node, and a fourth port node connected to the fourth node.

5. The filter arrangement according to claim 1, wherein the first resonator circuit includes a first capacitive element and a first line element, and wherein the second resonator circuit includes a second capacitive element and a second line element.

6. The filter arrangement according to claim 5, wherein the first capacitive element and the second capacitive element are formed by at least one of a capacitor interconnected against a reference potential, a capacitive line, and an open tap line.

7. The filter arrangement according to claim 5, wherein the first resonator circuit comprises a further capacitive element connected between the first line element and the second node, and wherein the second resonator circuit comprises a further capacitive element connected between the second line element and the fourth node.

8. The filter arrangement according to claim 7, wherein the further capacitive element is a capacitive line.

9. The filter arrangement according to claim 1, wherein the first resonator circuit and the second resonator circuit each comprise at least one resonator.

10. The filter arrangement according to claim 9,
wherein the inductive device includes a first inductive device connected between the first node and a fifth node, and a second inductive device connected between the third node and the fifth node;
wherein the further inductive device includes a third inductive device connected between the second node and a sixth node, and a fourth inductive device connected between the fourth node and the sixth node; and
wherein a further resonator circuit coupled to the first resonator circuit and to the second resonator circuit is connected between the fifth node and the sixth node.

11. The filter arrangement according to claim 10, wherein the first, the second and the further resonator circuit includes a plurality of coupled resonators.

12. A filter arrangement, comprising
a first resonator circuit, connected between a first node and a second node;
a second resonator circuit connected between the second node and a third node, wherein the first resonator circuit and the second resonator circuit are electro-magnetically or acoustically coupled; and
an inductive device connected between the second node and a fourth node;
a third resonator circuit connected between a fifth node and the fourth node; and
a fourth resonator circuit connected between a sixth node and the fourth node,
wherein the third resonator circuit and the fourth resonator circuit are electro-magnetically or acoustically coupled, and
wherein each of the first resonator circuit and the second resonator circuit include at least one of a line resonator, a BAW-resonator, a SAW-resonator, a dielectric resonator, a quartz resonator and an optical resonator.

13. The filter arrangement according to claim 12, wherein the first resonator circuit and the second resonator circuit define a passband, are coupled, and have a serial resonance in the passband.

14. The filter arrangement according to claim 12, further comprising a first port with a first port node connected to the first node, and a second port node connected to the fifth node, and a second port with a third port node connected to the third node, and a fourth port node connected to the sixth node.

15. The filter arrangement according to claim 12, further comprising a first port with a first port node connected to the first node, and a second port node connected to a reference potential, a second port with a third port node connected to the third node, and a fourth port node connected to the sixth node.

16. The filter arrangement according to claim 12, wherein each resonator circuit includes one capacitive element and one line element.

17. The filter arrangement according to claim 16, wherein the capacitive element is formed by a serially connected capacitor, by a capacitive line or by an open tap line.

18. The filter arrangement according to claim 12, wherein the resonator circuits each comprise at least one resonator.

* * * * *